(12) United States Patent
Levine et al.

(10) Patent No.: US 6,574,788 B1
(45) Date of Patent: Jun. 3, 2003

(54) METHOD AND SYSTEM FOR AUTOMATICALLY GENERATING LOW LEVEL PROGRAM COMMANDS AS DEPENDENCY GRAPHS FROM HIGH LEVEL PHYSICAL DESIGN STAGES

(75) Inventors: Margie Levine, Menlo Park, CA (US); Peter Dahl, Cupertino, CA (US); Byron Dickinson, San Jose, CA (US); Jagat Patel, Palo Alto, CA (US); Paul Rodman, Palo Alto, CA (US)

(73) Assignee: ReShape, Inc., Mountain View, CA (US)

( * ) Notice: Subject to any disclaimer, the term of this patent is extended or adjusted under 35 U.S.C. 154(b) by 119 days.

(21) Appl. No.: 09/712,418

(22) Filed: Nov. 13, 2000

(51) Int. Cl.$^7$ ................................................. G06F 17/50
(52) U.S. Cl. ............................... 716/18; 716/8; 716/11
(58) Field of Search ....................................... 716/1–21

(56) References Cited

U.S. PATENT DOCUMENTS

| | | | | |
|---|---|---|---|---|
| 5,519,630 A | * | 5/1996 | Nishiyama et al. | 364/490 |
| 5,528,508 A | * | 6/1996 | Russell et al. | 364/488 |
| 5,627,999 A | * | 5/1997 | Cheng et al. | 395/500 |
| 5,629,861 A | * | 5/1997 | Kim | 364/490 |
| 5,838,583 A | * | 11/1998 | Varadarajan et al. | 364/491 |

* cited by examiner

*Primary Examiner*—Vuthe Siek
(74) *Attorney, Agent, or Firm*—Wagner, Murabito & Hao LLP

(57) ABSTRACT

A method and system for automatically generating low level design tool commands as dependency graphs from abstracted high level physical design stages. The novel system inputs names of blocks of a hierarchical integrated circuit. Each block name has associated with it certain variables, stages and conditional statements. The stages represent a set of linked physical design processes that are to be executed on the block. Stages can be dependent on other stages and therefore are executed in-order on the block depending on how they are linked in the input set. The system automatically generates, from the input set, a dependency graph for each block. The dependency graph includes a large volume of nodes with associated parameters and options. Each node includes one or more low level program commands ("tasks") for directing a number of physical design tools, e.g., programs, to perform various functions with respect to the block. Each node can receive input and generate an output. If the input to a particular node has not been altered, e.g., since the last time the graphs were executed, then that node is not executed in the current run. Dependency graphs that are not data dependent can be executed in parallel. If the input set is altered, a new set of dependency graphs can automatically be generated. By grouping the physical design operations into stages, the novel system allows the user to abstract the problem of dealing with large numbers of physical design tasks into the more manageable problem of dealing with high level "stages" in the physical design process.

24 Claims, 12 Drawing Sheets

590a

METHOD AND SYSTEM FOR AUTOMATICALLY GENERATING LOW LEVEL PROGRAM COMMANDS AS DEPENDENCY GRAPHS FROM HIGH LEVEL PHYSICAL DESIGN STAGES

BACKGROUND OF THE INVENTION

1. Field of the Invention

The present invention relates to the field electronic design automation (EDA). More specifically, embodiments of the present invention relate to an EDA system having an improved physical design system for hierarchical integrated circuit designs.

2. Related Art

An electronic design automation (EDA) system is a computer system used for designing integrated circuit (IC) devices. The rapid growth of the complexity of modern electronic circuits has forced electronic circuit designers to rely upon computer programs to assist or automate most steps of this design process. Typical circuits today contain hundreds of thousands or millions of individual pieces or "cells." Such a design is too large for a circuit designer or even an engineering team of designers to manage effectively without computer systems.

In general, the EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation, for instance. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs. The netlist is typically stored in computer readable media within the EDA system and processed and verified using many well known techniques.

FIG. 1 illustrates a typical integrated circuit design netlist that includes a number of hierarchical organized cells including a top level block 40 having a number of lower level circuit blocks 10–30 within. Each circuit block 10–30 includes a number of cells and or other blocks.

Once the netlist is complete, the actual physical size, dimensions, geometry and placement of the cells within the blocks can be determined. Determining this geometric information is the function of an automatic placement process and an automatic routing process, both of which are parts of the "physical design" process and are typically computer programs. The designer supplies the netlist into the computer implemented automatic cell placement process. The automatic placement computer program finds a location for each cell on a circuit board or silicon chip. The locations are specified, typically, in two dimensional spatial coordinates, e.g., (x, y) coordinates, on the circuit board or silicon chip. The locations are typically selected to optimize certain objectives such as wire length, wire routibility, circuit speed, circuit power consumption, and/or other criteria, and typically subject to the condition that the cells are spread evenly over the circuit board or silicon chip and that the cells do not overlap with each other. The output of the automatic cell placement process includes a data structure including the (x, y) position for each cell of the design.

Typically, placement is done in two steps including a first coarse placement process, then detailed a placement process. The coarse placement process finds approximate cell locations which optimize the desired metrics and spreads cells evenly across the silicon chip or circuit board. In the output data structure, some cells still overlap and no cells are in legal site locations, so the coarse placement needs to be legalized before the circuit can be fabricated. The detailed placement inputs the data structure output by the coarse placement and generates the detailed placement which does not have overlap and all are located on legal sites.

Next, the designer supplies the netlist and the cell location data structure, generated by the placement program, to a computer implemented automatic wire routing process. This computer program generates wire geometry within data structure. The wire geometry data structure and cell placement data structure together are used to make the final geometric database needed for fabrication of the circuit.

In executing the above physical design programs or "design-tools," many low level commands with associated parameters, options, variables and target databases are required. In some instances, up to 1,000 of these commands may be required to merely place one block. The commands perform low level functions for the design tools, e.g., a placer, such as: 1) initializing the placer for placement; 2) performing placement on a block; 3) evaluating the result; 4) formatting the data so that it can be understood; and 5) preparing the data for the next stage in the physical design process. Therefore, while the concept of performing a placement on a block can be abstracted to a high level operation, the actual commands given to the design tool to implement that operation are quite volumous.

Furthermore, physical design tools need to be executed on each block separately and then on the whole design. Separate sets of commands are required for each block that is to be processed. During the placement, other design tools may be required to check for any design rule violations or to perform optimizations, or to add special resources such as clocks and power lines, etc. The above process is then repeated for routing. As a result, multiple sets of commands are required for each physical design process to be completed and these commands are repeated over each block. In short, the actual command set required of the designer to merely place and route the netlist 40 of FIG. 1 may require tens of thousands of low level commands which need to be input to the physical design tools in a particular order.

In an effort to address the daunting task of managing these commands, chip designers have written small "execute" programs that function to access a block of the netlist and depending on which block is obtained, apply a predetermined set of commands to the block involving the physical design tools. Once a block is processed, the next one is automatically obtained. Loops can be placed in the programs for processing multiple blocks in the same way, e.g., using the same set of commands. However, the computer time required to perform a place and route on a typical design is very long. Should there be a problem with the execute program, or a problem with the placement or routing of the netlist, or a problem in one of the commands, then the entire execute program needs to be re-run from scratch once the problem is isolated and fixed. Therefore, this prior art approach is not very efficient in the face of design errors or program bugs which are always present. Furthermore, although this prior art approach helps to automate some of the designer's job, it still requires that in the development or modification of the execute program, the designer needs to use and edit the low level, voluminous detailed commands. As such, this development process can be tedious, error-prone and time consuming.

Another prior approach to solving the problem of dealing with these low level commands is utilize a program such as the UNIX Make, which is well known and commercially available. The program, Make, allows dependency graphs to be used indicating the input and the output of certain nodes, with each node representing a design tool task to be performed. In order to place and route the netlist, the graphs are analyzed to determined which nodes need which data and the appropriate node execution is then performed in the order dictated by the data dependencies. On subsequent re-runs of the netlist, if a node's input has not changed since the last run, then the node is not executed and its output is similarly re-used. Although offering efficient executions, this prior approach requires that the entire physical design process be hand-coded in the low level commands required of the design tools. This approach does not offer any flexibility in dealing with similar blocks or in adding or deleting or modifying commands because any such activity must be performed by hand, with an editor, directly on the low level commands. For instance, to run the same design tool over various blocks requires that the same code be block copied for each block, e.g., using an editor. To change a variable or parameter within the design tools requires that the code portion relating to that design tools be identified and manually modified. Again, this approach is very tedious, error-prone and time consuming.

SUMMARY OF THE INVENTION

Accordingly, what is needed is a system and method for providing the flexibility offered by the "execute programs" while still providing the execution efficiency offered by the dependency graphs described above. The present invention provides these advantages and others not specifically mentioned above but described in the sections to follow.

A method and system are described for automatically generating low level design tool commands as dependency graphs from abstracted high level physical design stages. The novel system inputs names of blocks of a hierarchical integrated circuit. Each block name has associated with it certain variables, stages and conditional statements. The stages represent a set of linked physical design processes that are to be executed on the block. Stages can be dependent on other stages and therefore are executed in-order on the block depending on how they are linked in the input set. The system automatically generates, from the input set, a dependency graph for each block. The dependency graph includes a large volume of nodes with associated parameters and options. Each node includes one or more low level program commands ("tasks") for directing a number of physical design tools, e.g., programs, to perform various functions with respect to the block. Each node can receive input and generate an output. If the input to a particular node has not been altered, e.g., since the last time the graphs were executed, then that node is not executed in the current run. Dependency graphs that are not data dependent can be executed in parallel. If the input set is altered, a new set of dependency graphs can automatically be generated. By grouping the physical design operations into stages, the novel system allows the user to abstract the problem of dealing with large numbers of physical design tasks into the more manageable problem of dealing with high level "stages" in the physical design process.

More specifically, an embodiment of the present invention includes a method of performing physical design operations on an integrated circuit netlist, in a computer system, said method comprising the steps of: a) accessing an input file containing identifications of a plurality of blocks of cells of the integrated circuit netlist, each block having defined therefor a respective set of linked stages representing high level physical design operations to be performed on each block; b) defining for each stage, a group of low level tasks to be performed in order to accomplish the stage, the low level tasks comprising commands, parameters and data to be supplied to physical design tools; c) automatically generating, based on the input file, a separate dependency graph for each block of the plurality of blocks by mapping the associated set of linked stages, for each block, to their corresponding low level tasks and maintaining data dependencies therein; and d) executing the dependency graphs to perform physical design operations on the integrated circuit netlist as defined by the input file, wherein only nodes of the dependency graphs having changed inputs are executed by step d).

Embodiments include the above and wherein the changed inputs of the step d) are evaluated based on the last execution of the d) for the netlist. Embodiments include the above and further comprising the steps of: e) modifying the input file wherein the set of stages is modified for at least one block of the plurality of blocks; f) performing step c) on the input file, as modified by the step e), to automatically generate modified dependency graphs; and g) performing step d) on the modified dependency graphs generated by the step f). Embodiments also include the above and wherein the high level physical design operations comprise, for each block, cell placement, cell routing, floorplanning and design rule checking.

The novel method and system described above offer several advantages over the prior art. First, by grouping the physical design tasks into high level stages, the system allows the user to abstract the problem of dealing with large numbers of physical design tasks into the more manageable problem of dealing with high level, understandable "stages" in the physical design process. Second, by allowing the user to specify how to link together the stages on a per-block basis, the system allows the user to generate different dependency graphs for different blocks in the design with a minimum of effort because the stages and link information is readily understandable, at a high level, and not voluminous.

Third, by including the dependencies of all blocks in one large dependency graph, the system insures that the program which executes the dependency graph has access to all information necessary to parallelize the physical design to the maximum degree thereby providing a very efficient system for executions and re-executions.

Fourth, by representing each stage with multiple nodes in a dependency graph, the system provides a number of unique and novel advantageous benefits For insance, the system achieves maximum parallel execution of tasks associated with a stage. Due to the independent nature of blocks in a hierarchical design, this means that many tasks may execute in parallel, minimizing the time to complete the entire hierarchical physical design. Also, execution time can be substantially reduced because if tasks associated with a particular node fail, the user can restart execution at that node, without the penalty of having to re-execute tasks which have previously executed successfully. Moreover, if tasks associated with a particular node fail, other tasks associated with nodes that are not dependent upon the failing node can continue execution.

Lastly, by allowing the user to readily identify the one or more target nodes in the dependency graph, the system gives the user full flexibility to execute multiple different physical design tasks in parallel.

DETAILED DESCRIPTION OF THE INVENTION

In the following detailed description of the present invention, a method and system for automatically generating a set of dependency graphs from an input definition of high level linked stages for cell blocks and executing that dependency graph to perform physical design operations, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory, e.g., process 500. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or "generating" or "accessing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

General Purpose Computer System 112

Figure 1:
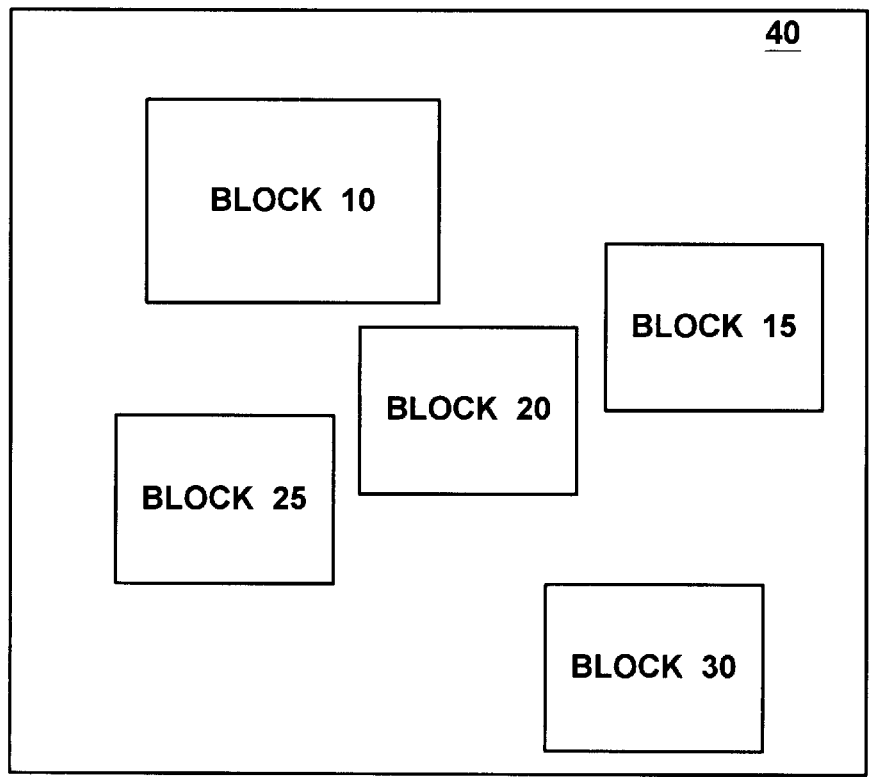
FIG. 1 illustrates a prior art netlist of an integrated circuit including a hierarchical organization of cell blocks including a top level block and several lower level blocks.
Figure 2:
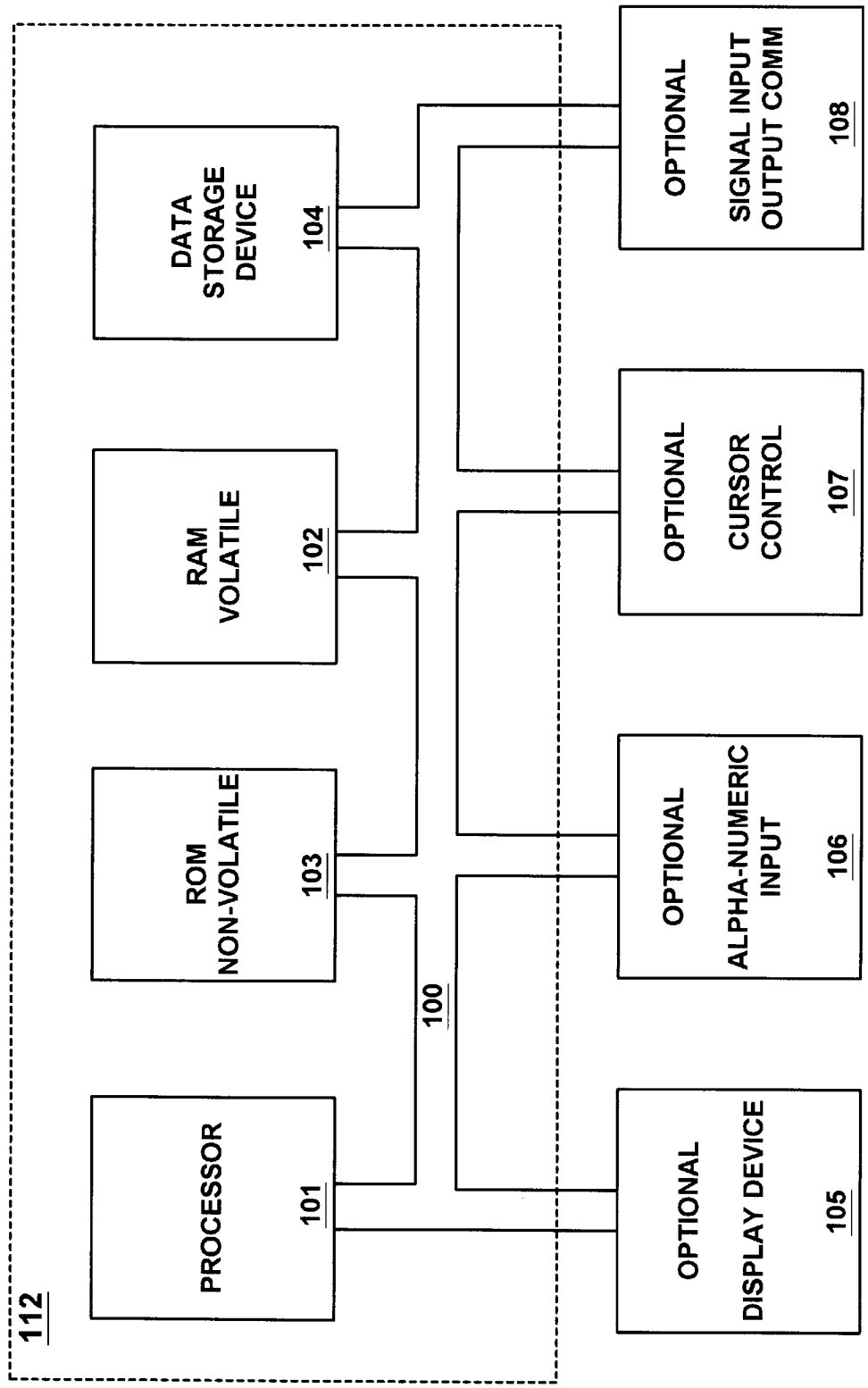
FIG. 2 is a block diagram of a general purpose computer aided design (CAD) system that can be used as a platform to implement various embodiments of the present invention.

With reference to the method and systems described herein, several aspects are described in terms of steps executed on a computer system or CAD system. Although a variety of different computer systems can be used with the present invention, an exemplary computer system 112 is shown in FIG. 2. In general, computer system 112 that can be used by the present invention includes an address/data bus 100 for communicating information, a central processor 101 coupled with the bus for processing information and instructions, a volatile memory 102 (e.g., random access memory) coupled with the bus 100 for storing information and instructions for the central processor 101 and a non-volatile memory 103 (e.g., read only memory) coupled with the bus 100 for storing static information and instructions for the processor 101. System 112 also contains a data storage device 104 such as a magnetic or optical disk and disk drive coupled with the bus 100 for storing information and instructions, a display device 105 coupled to the bus 100 for displaying information to the computer user, an optional alphanumeric input device 106 including alphanumeric and function keys coupled to the bus 100 for communicating information and command selections to the central processor 101, an optional cursor control device 107 coupled to the bus for communicating user input information and command selections to the central processor 101, and a signal generating device 108 coupled to the bus 100 for interfacing with other networked computer systems.

It is appreciated that the optional display device 105 of FIG. 2 utilized with the computer system 112 of the present invention may be a liquid crystal device, cathode ray tube, or other display device, or hardcopy device, suitable for creating graphic images and alphanumeric characters.

Automatic Maker Process of an Embodiment of the Present Invention

Hierarchical physical design is a complex process which requires many tasks to be executed on behalf of each cell block ("block") in an integrated circuit design ("design"). The blocks contain a number of individual cells (or other blocks) and the cells perform certain functions. The overall collection of blocks are organized in a hierarchical fashion with a top level cell and other lower levels inside the top level or inside other lower level blocks. The design can be called a "netlist" and represents an integrated circuit device. Physical design is the task of taking the netlist representation of the integrated circuit device and producing a physical design, e.g., "mask," that can be directly fabricated on a substrate, e.g., silicon. Generally, the number of blocks in a design is between 4 and 30, but may be more or less, and the number of operations executed on each block for the physical design process is generally in the hundreds.

Figure 3:
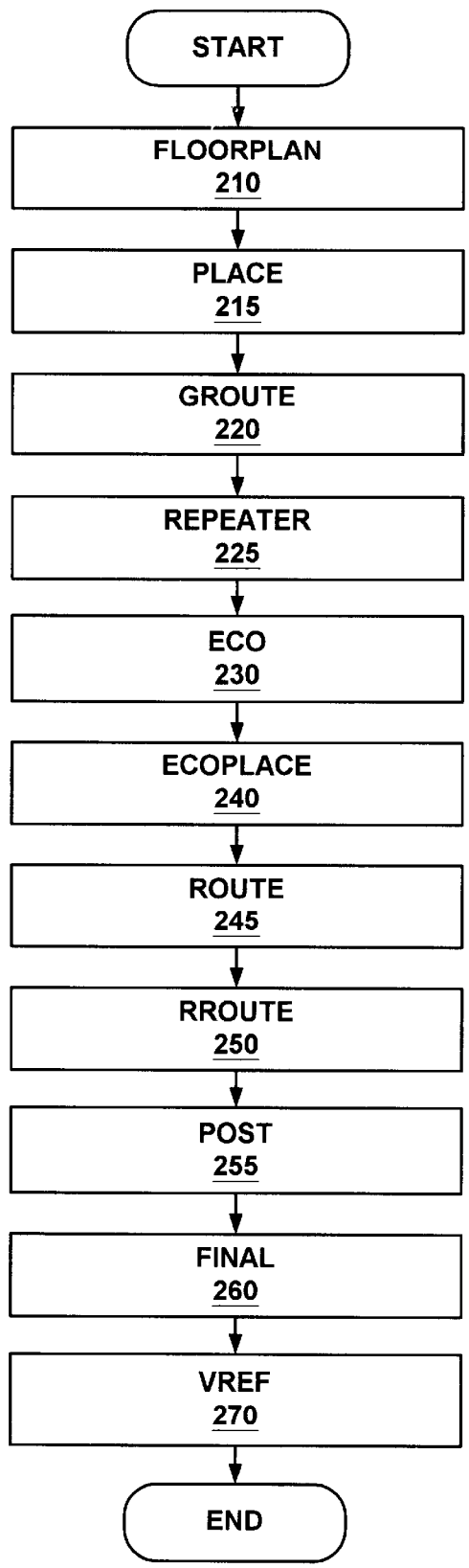
FIG. 3 illustrates a flow diagram of possible high level physical design operations that can be represented by the stages in accordance with embodiments of the present invention.

FIG. 3 illustrates an exemplary set 205 of high level physical design operations or "stages" that can be performed on a block. As shown in FIG. 3, the set 205 is a linked set of stages because data dependencies dictate a particular operational order (and data flow) as shown by the arrows. In the present invention, a respective set of linked stages can be defined for each block of the input design. Any given set of linked stages can include one or more, or all, of the stages as indicated by FIG. 3. The variation depends on the designer and the number of operations that are desired to be implemented, or appropriate to be implemented, on a particular block. Since each block has its own definition of linked stages, a given stage is said to be "associated with" or "defined for" a particular block.

Also associated with each stage are possible variables that tune the operation of the stage. Conditional statements, described below, can also be associated with each stage. These variables are defined by the user and can be particular to the environment under which physical design is being done. For instance, the conditional statements can indicate conditions in which the stage would be bypassed. Variables can indicate parameters that can tune the stage. In one example, the variables can indicate whether or not timing is run in conjunction with the stage. Also, variables can indicate whether or not certain rule checking is performed, e.g., these programs can check for the following conditions: were all the instances in the block processes, were all the pins routed, are any geometries overlapping, etc.?

The stages of the physical design flow that can be defined for a given block, in one embodiment of the present invention, are described in more detail below with reference to FIG. 3. It is appreciated that more or fewer stages can be defined for any given block and that the stages shown are exemplary only. In the high level floorplan stage 210, this stage adds user-specified physical design information to the associated block, such as power grids and clocking structures, macro placements, and site and route obstructions. Therefore, a designer that includes this stage for a given block wants these resources added to the block. The floorplanner stage adds cells and other resources to the associated block. Variables included with this stage 210 define which resources to add to the associated block. A conditional statement associated with stage 210 indicates if special conditions exist which would temporarily bypass this stage from the set of stages for the block. Floorplanners are well known physical design tools.

In the high level place stage 215, the computer system places standard cells (of the associated block) in design using an automatic placer. An automatic placer is a software program which is a physical design tool. Automatic placers are well known. Variables may tune how the placement is performed and a conditional statement associated with stage 215 indicates if special conditions exist which would temporarily bypass this stage from the set of stages for the block. In the high level groute stage 220, the computer system automatically performs a global route of the design of the associated block, e.g., connects cells using wire connections or "nets," globally. An automatic global router is a well known software program which is a physical design tool. Variables may tune how the routing is performed and a conditional statement associated with stage 220 indicates if special conditions exist which would temporarily bypass this stage from the set of stages for the block.

In the high level repeater stage 225, the computer system automatically adds repeaters to the associated block. A repeater process is a well known software program which is a physical design tool. Variables may tune how and where the repeaters are added to the block and a conditional statement associated with stage 225 indicates if special conditions exist which would temporarily bypass this stage from the set of stages for the block. In the high level ECO stage 230, the computer system automatically adds engineering change orders to the associated block based in block timing. The ECO process is a well known software program which is a physical design tool. Variables may tune the manner in which ECO are added to the block and a conditional statement associated with stage 230 indicates if special conditions exist which would temporarily bypass this stage from the set of stages for the block.

In the high level ECOplace stage 240, the computer system automatically places the block to "jiggle" into place those cells that have been added through an ECO. An ECOplace process is a well known software program which is a physical design tool. Variables may tune the manner in which cells are added to the block and a conditional statement associated with stage 240 indicates if special conditions exist which would temporarily bypass this stage from the set of stages for the block.

In the high level route stage 245 of FIG. 3, the computer system automatically routes the pins of the cells of the block with wire connections. A router process is a well known software program which is a physical design tool. Variables may tune the manner in which cells are routed in the block and a conditional statement associated with stage 245 indicates if special conditions exist which would temporarily bypass this stage from the set of stages for the block. In the high level rroute stage 250, the computer system automatically repairs routes of the block. A repair router process is a well known software program which is a physical design tool. Variables may tune the manner in which routes are repaired in the block and a conditional statement associated with stage 250 indicates if special conditions exist which would temporarily bypass this stage from the set of stages for the block.

In the high level post stage 255, the computer system automatically performs a simplified design rule checking on the cells of the block to locate possible design errors. A simplified design rule checker process is a well known software program which is a physical design tool. Variables may tune the manner in which design rule checking is done and a conditional statement associated with stage 255 indicates if special conditions exist which would temporarily bypass this stage from the set of stages for the block.

In the high level final stage 260, the computer system automatically performs a final GDS process on the block to represent polygons on layers. A GDS process is a well known software program which is a physical design tool. Variables may tune the manner in which the GDS process is done and a conditional statement associated with stage 260 indicates if special conditions exist which would temporarily bypass this stage from the set of stages for the block.

In the high level vref stage 270, the computer system automatically performs a final design rule checking on the cells of the block to locate possible design errors. A final design rule checker process is a well known software program which is a physical design tool. Variables may tune the manner in which final design rule checking is done and a conditional statement associated with stage 270 indicates if special conditions exist which would temporarily bypass this stage from the set of stages for the block.

Figure 4:
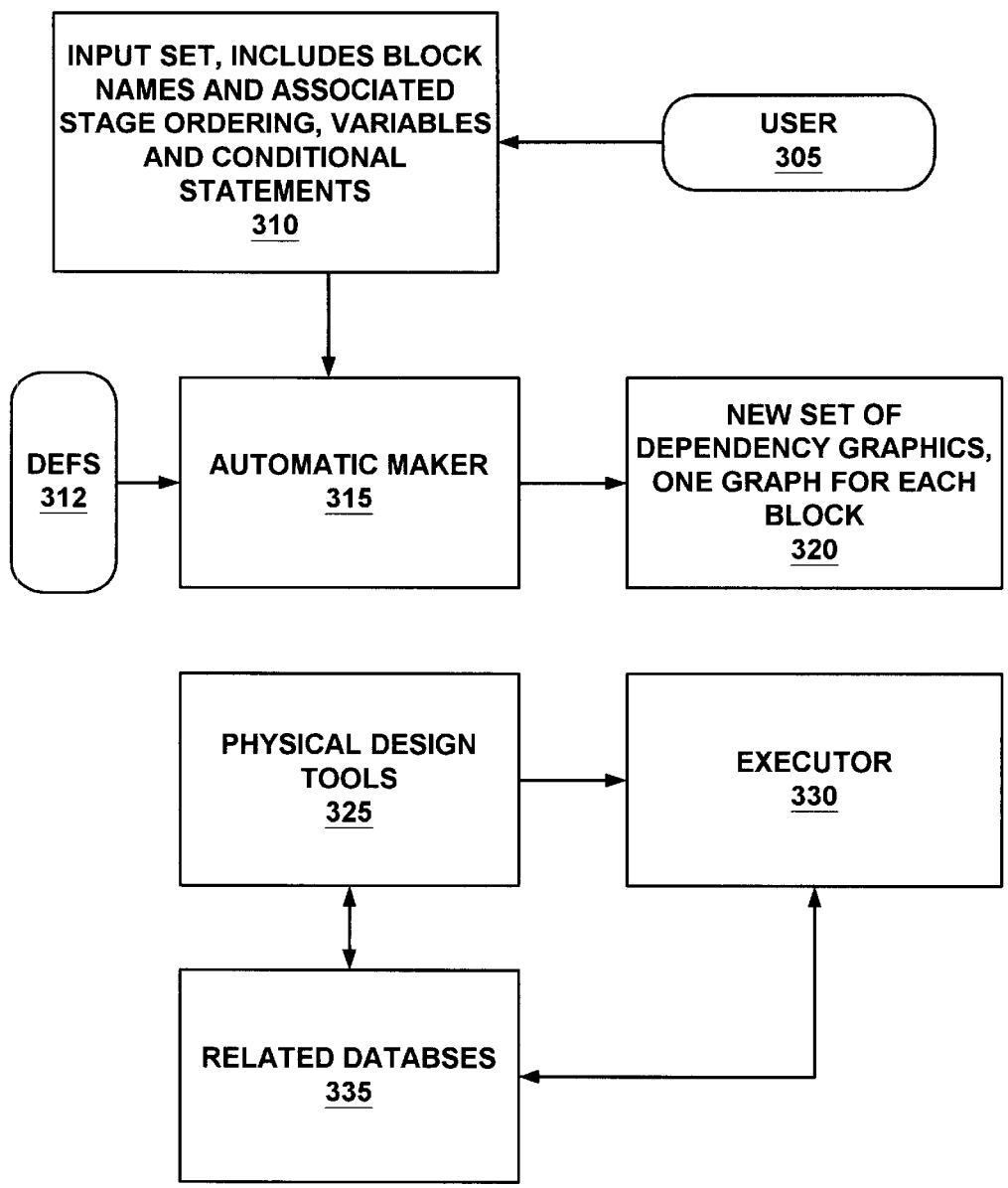
FIG. 4 is a data flow diagram in accordance with an embodiment of the present invention illustrating the data flow involving the automatic maker process and the executor process and other processes and databases.

FIG. 4 illustrates a system 300 in accordance with an embodiment of the present invention. System 300 operates to automatically generate a set of dependency graphs, based on an input file of high level operations, where the dependency graphs are executed on related databases that represent a netlist of an integrated circuit. The netlist is represented as a series of blocks organized in a hierarchy. The dependency graphs can be executed by design tools in order to perform physical design operations on the blocks. Generally, system 300 includes software programs and database resources.

Within system 300, the user 305 supplies an input file or input "set" 310. The input file includes an identification of each block in the input netlist. For each block, the input file 310 also defines a respective set of high level linked stages and variables and conditional statements associated with each stage. The set of linked stages associated with a particular block define high level physical design operations to be performed on the associated block. The input file 310 can be created via an editor program or any other type of well known graphical user interfaces. The input file 310 can be viewed as a description by the user of how the stages should be linked together for each block and where data dependecies are defined and maintained.

An automatic maker process 315 of the present invention receives the input file 310 and, for each block, automatically generates a dependency graph for the block. This is performed for all blocks in the input file to generate one large set of dependency graphs 320. The dependency graphs 320 each includes nodes and connections between the nodes. The connections between the nodes indicate data flow (and data dependency) between the nodes, and the nodes themselves indicate one or more low level tasks or commands (per node), with associated parameters, data, etc., that are necessary to realize the linked stages. Therefore, a stage of the set of linked stages (for a given block) can be translated into multiple linked nodes. It would not be uncommon for one high level stage to be translated into hundreds of low level tasks. Each low level task or command is a command with related parameters and data to be fed into a physical design tool program 325 causing the tool to perform some function. As these commands are very numerous and complex, it is advantageous to have the automatic maker 315 generate them on-the-fly for each block based on a higher level description 310 which easier to understand and manipulate by the user.

In order to automatically produce the sets of dependency graphs 320 for the input file 310, the automatic maker requires a definition file 312. The definition file 312 contains a grouping of low level tasks according to the stage in which they belong. In other words, in file 312, the system groups of sets of physical design tasks into stages. Since each stage can accept a number of different variables, the tasks defined in file 312 are defined with reference to certain default settings which can be altered by the input variables. The particular mapping of a stage to a set of tasks is dependent on the kind of physical design operation that a particular designer desires. Using an editor, or other graphical user interface, the designer can add, modify or delete tasks that are associated with a paritulcar stage, as desired. However, once programmed, each stage defined in the input file 310 will be mapped to the particular tasks as programmed in the definition file 312.

The automatic maker 315 of FIG. 4 examines the set of linked stages for each block from file 310 and maps those stages into the set of tasks (from file 312) that correspond to each stage, on a stage by stage basis. Process 315 links all of the tasks in order (for the block) according to the data dependencies set forth by the set of linked stages and according to the data dependencies set forth by the definitions in file 312. The tasks required to complete the set of linked stages for a given block, and the order in which they are to be executed based on their data dependencies, are defined as the dependency graph for the block. The above process is performed for each block of the input file 310 to automatically produce a set of dependency graphs 320 corresponding to the input file 310.

Once the set of dependency graphs 320 are generated, they can be executed by an executor process 330 which commands the physical design tools 325 to perform specific functions based on the nodes. The executor process 330 is a mechanism for executing up to (and through) one or more nodes in the dependency graph. This mechanism allows the user to identify one or more target nodes in the dependency graph and pass that information to a program which will execute all dependencies necessary to execute those target nodes as well as the target nodes themselves. In addition to the set of dependency graphs 320, the executor process 330 also receives an input string which identifies a "target node" in the dependency graph.

Based on the dependencies in the graph, the executor process 330 executes all nodes in the dependency graph which must be executed (prior to and including the target node) in the order specified in the graph. To do this, the executor process 330 receives the dependency graph 320 and determines which of the nodes are receiving input data that is changed since the last time this netlist was processed. Only the nodes that receive new data are allowed to execute. The executor process 330 then determines which of the nodes that need to be executed can be executed in parallel, e.g., which nodes do not have any cross data dependencies. These nodes are then allowed to execute in parallel as computer resources allow. The inherent data in the dependency graphs allow the executor process 330 to determine the execution order of data dependent nodes. This entire process 330 is run for all blocks of the input file 310.

During the execution of the nodes, each node contains command, data and parameters that invoke certain actions from physical design tools 325. Therefore, the executor process 330 interfaces directly with the physical design tools 325 and invokes certain tools as indicated by the dependency graphs. Since the commands within the nodes outline functions to be performed on the blocks themselves, and other resources, the executor process 330 and the physical design tools 325 are interfaced with the related databases 335 which contain all required information about the blocks and the netlist in general, along with design rules, design constraints, etc. The physical design tools 325 include the well known suite of physical design applications, such as floorplanners, routers, placers, design rule checkers, repeaters, etc.

After the executor process 330 has completed, the related databases 335 are altered in some fashion to reflect the physical design operations performed thereon based on the input file 310. In one embodiment of the present invention, the dependency graphs 320 are in the Makefile format which is a file according to the Make program. A Makefile is a common UNIX representation of a dependency graph. With a Makefile format, the program Make can be used as the executor process 330, in one embodiment. Make is a standard UNIX program which executes tasks specified in a Makefile, based on the dependency graph described by the Makefile.

Figure 5A:
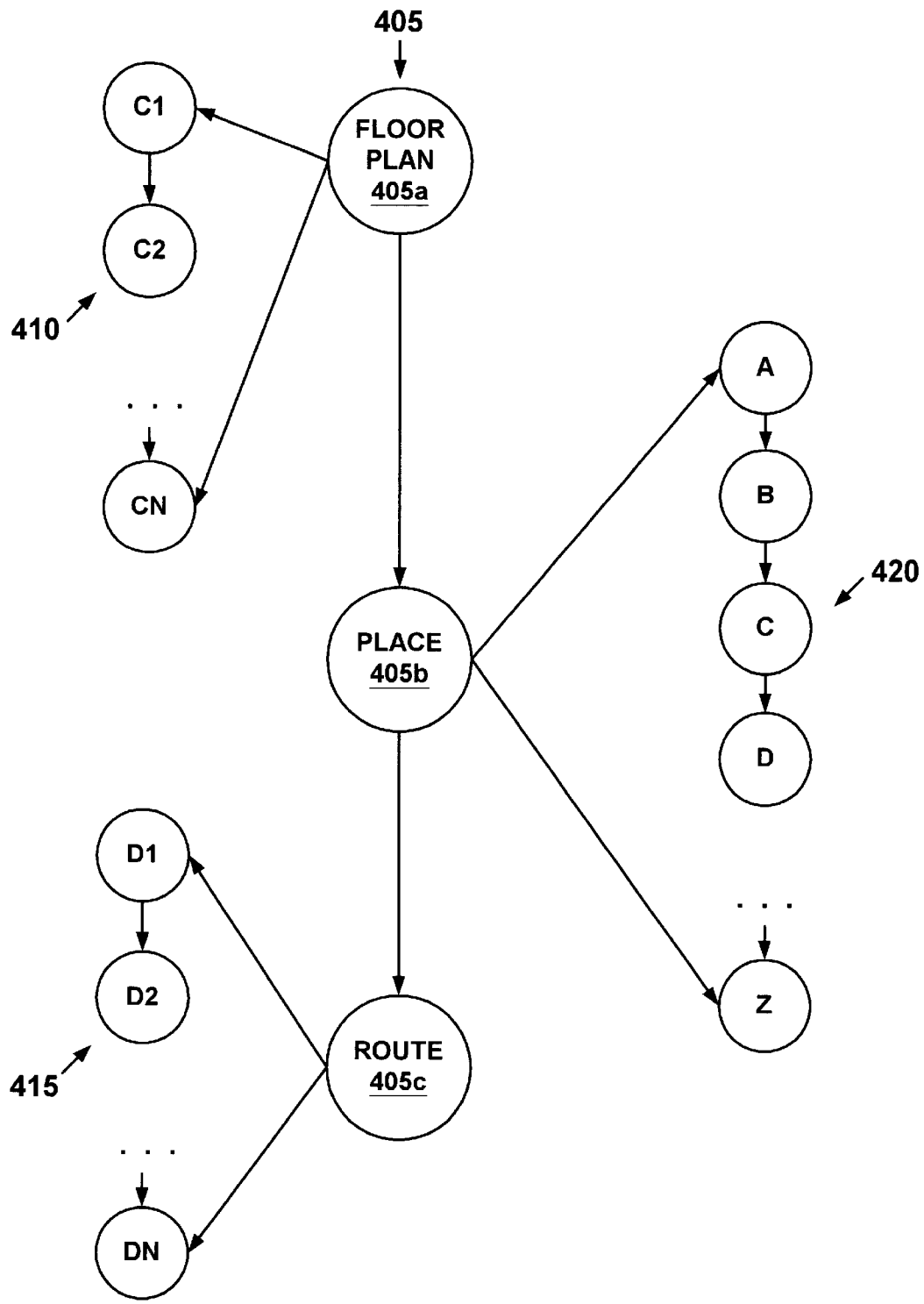
FIG. 5A illustrates a mapping between an exemplary set of linked stages and their corresponding low level tasks in accordance with an embodiment of the present invention.

FIG. 5A illustrates an example set of linked stages 405a, 405b and 405c that correspond to an exemplary block. The set includes floorplanning, placing and then routing. No other stages are defined for this block. As shown, the floorplanning stage 405a is translated by step 315 (FIG. 4) into several nodes 410, including C1 through Cn, each node containing one or more low level tasks including commands, parameters and data for a design tool. It is appreciated that the nodes C1 through Cn may contain certain specific parameters and/or data that are specified by the variables of the input file 310. There may be as many as hundreds of tasks within nodes 410 C1 through Cn. Likewise, the placer stage 405b is translated by step 315 (FIG. 4) into several nodes 420, including A, B, C, . . . , Z. It is appreciated that these nodes may contain certain specific parameters and/or data that are specified by the variables of the input file 310. Again, the routing stage 405c is translated by step 315 (FIG. 4) into several nodes 415, including D1 through Dn. It is appreciated that these nodes may contain certain specific parameters and/or data that are specified by the variables of the input file 310.

The nodes that each stage is broken down into represent the low level commands that must be performed in order to implement the related stage. For instance, if the stage is a placer stage, 405b, then the nodes, A–Z, may include functions which 1) prepare to run the placer; 2) run the placer on the data; 3) evaluate the output; 4) format the data so that it can be read and understood; and 5) prepare the data for the next stage that requires it. All of these low level task can be broken down into commands, variables and data that are used to conduct, e.g., command, various physical design tools 325 (FIG. 4).

Figure 5B:
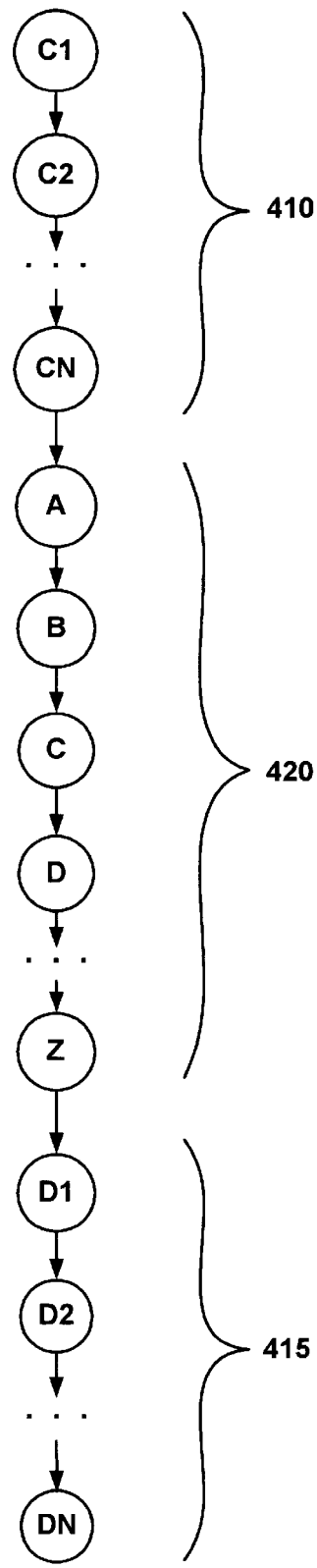
FIG. 5B illustrates the resulting exemplary dependency graph generated for the exemplary set of-linked stages illustrated in FIG. 5A.

As shown by FIG. 5B, the data dependencies of the set of linked stages 405 (FIG. 5A) defines the overall ordering of the nodes in the resultant dependency graph 425 for the set of linked stages 405, which graph is generated by step 315 for the exemplary block. Graph 425 represents only one graph of the total set of graphs within 320 (FIG. 4).

Figure 6:
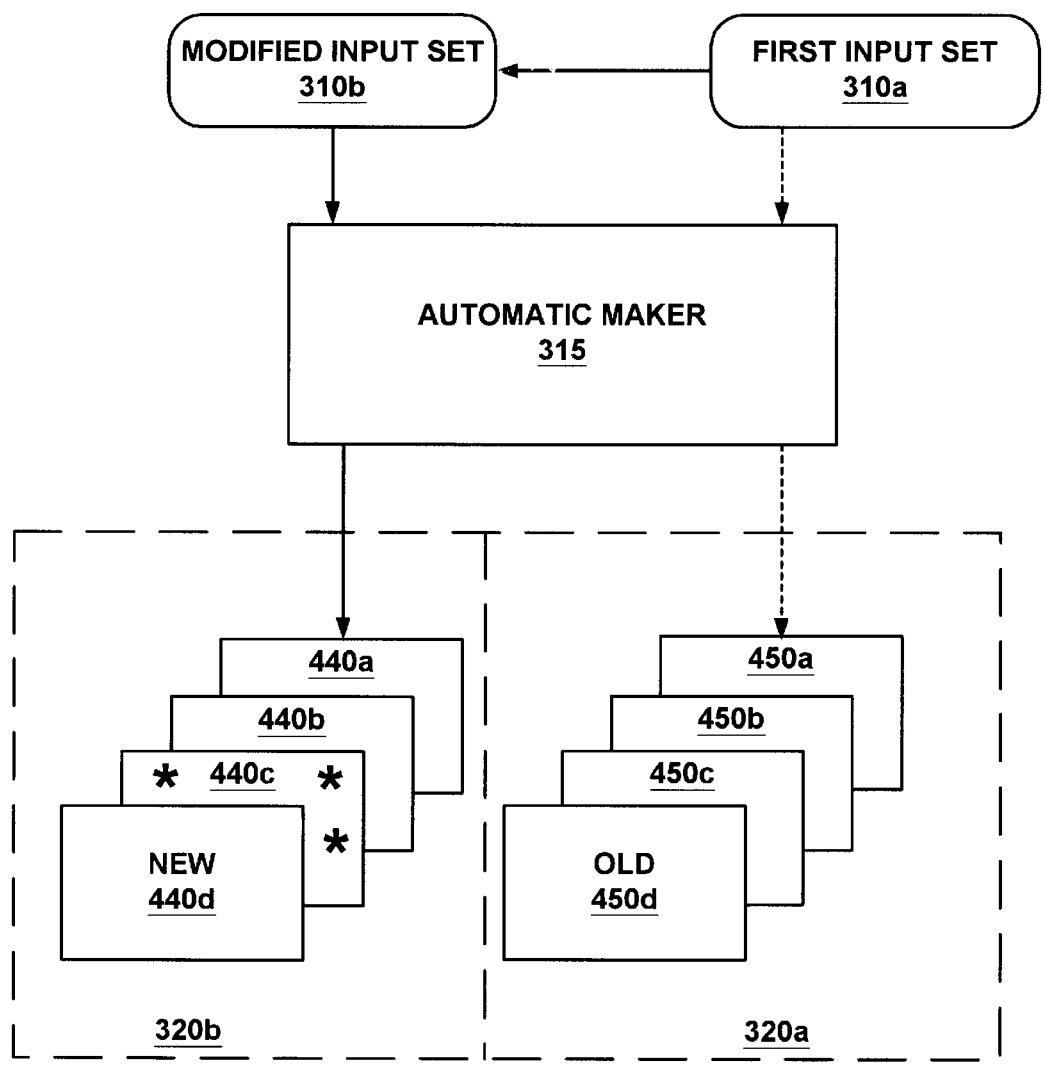
FIG. 6 is a data flow diagram of one embodiment of the present invention illustrating the automatic maker generating two different dependency graphs for two different input files, an initial input file and a modified input file.

FIG. 6 illustrates an exemplary use of system 300 by a physical designer. FIG. 6 illustrates the automatic maker 315 and an initial input file 310a. The initial input file 310a generates an initial set of dependency graphs 320a when fed through the automatic maker 315. This set 320a is then executed by the executor process 330 (FIG. 4) to cause changes in the related database structures. Set 320a includes four exemplary graphs 450a–450d.

In the event of one or more physical design operations failing to meet certain requirements or specified constraints, or for any reason, the designer then creates a modified input set 310b of FIG. 6. The modified input set 310b may contain different variables, different conditional statements, or may actually change the stages in the set of linked stages for one or more blocks of the netlist. Alternatively, all of the above changes can be performed. The modified input set 310b is then processed through the automatic maker 315 which automatically generates the modified set of dependency graphs 320b. Set 320b includes four exemplary graphs 440a–440d. However, only graph 440c has changed as a result of the modifications performed in file 310b. Assuming the graphs are not cross data dependent, the executor process 330 (FIG. 4) need only execute one or more nodes of graph 440c, and any other node that needs data produced by this graph 440c. Graphs 440a and 440c–d need not be executed.

It is appreciated that the present invention provides an efficient mechanism for producing the two sets of dependency graphs 320a–b based on a relatively brief and easy to understand input file of high level physical design operations. It is further appreciated that the dependency graphs 320a–b can be quite large including volumous commands having complex syntax and very repetitive because many operations need to be performed over and over again. To produce and/or edit such a file by hand is very tedious, cumbersome and very error prone given the technical nature of the design tools which they command. Generating such a file automatically and also providing a way to make alterations to the physical design operation and then have the new file automatically generated is very advantageous and time saving.

Figure 7:
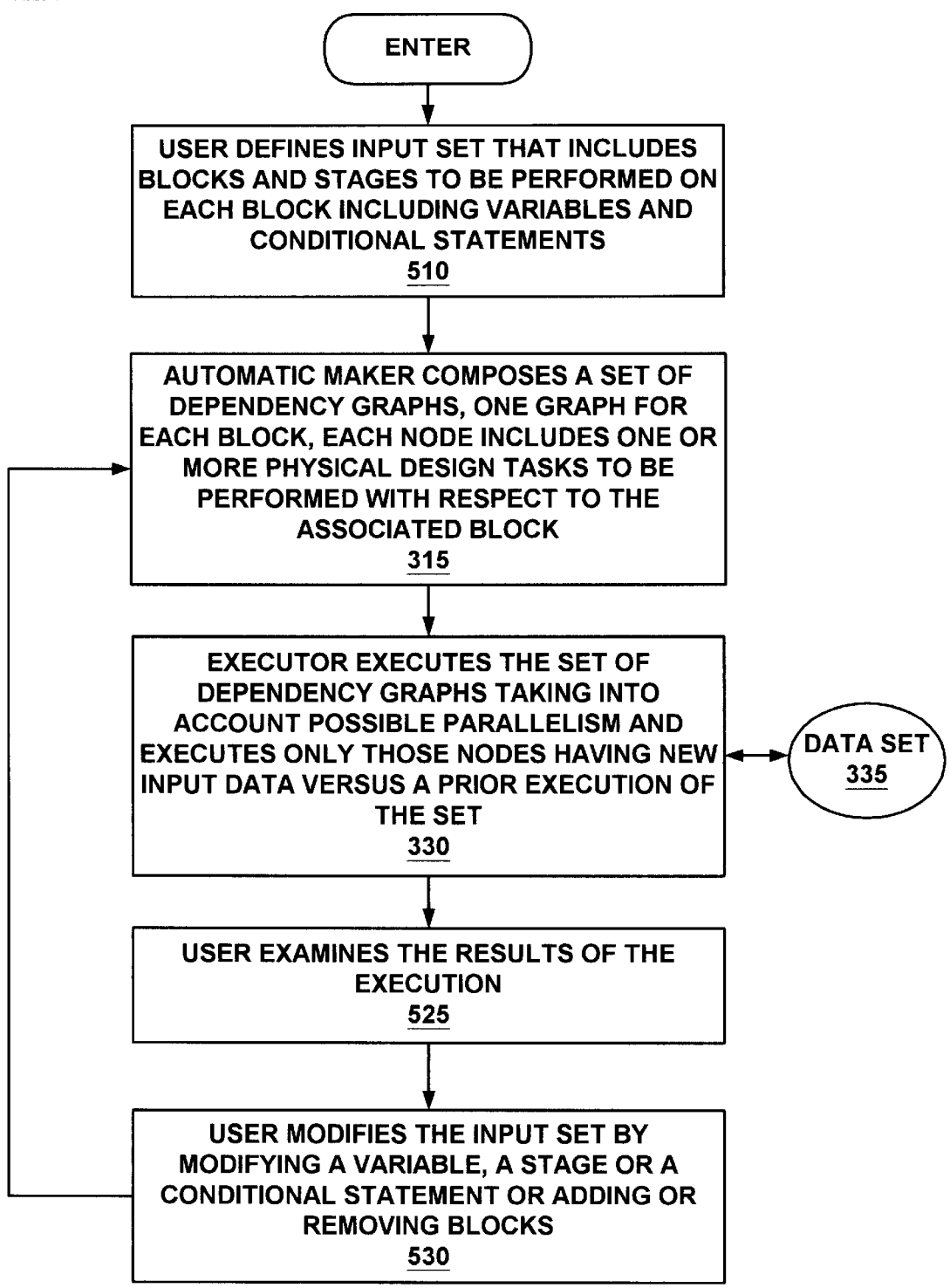
FIG. 7 illustrates a flow diagram of computer implemented steps performed in accordance with an embodiment of the present invention.

FIG. 7 illustrates a process 500 in accordance with an embodiment of the present invention. Process 500 may be implemented by instructions stored in computer memory and executed by a processor. At step 510, a user defines an input set including identifications, e.g., names, of blocks of a netlist and linked stages for each block. The linked stages are high level physical design operations to be performed on the associated block. The input file can also define, for each block, certain variables and conditional statements which are related to the linked stages.

At step 315, the automatic maker program automatically translates the linked stages, for each block, into a dependency graph for each block. Each node includes one or more low level tasks that include a command, a variable and related data. This is performed for all blocks to generate a set of dependency graphs. At step 330, the executor process then executes the nodes of the set of dependency graphs to command the physical design tools to implement operations defined by the input file. This interfaces with the related databases 335 and alters them.

At step 525, the user can inspect the results of the executor process to determine if the physical design is over or needs modification. If modifications are required, they can be performed at step 530. At step 530, the variables of the input file can be changed, the conditional statements can be changed or the stages as defined for the blocks can be altered for one or more blocks. The modified input file is then passed back to step 315 to produce a new output. The overall process 500 can be run until physical design is completed.

Figure 8A:
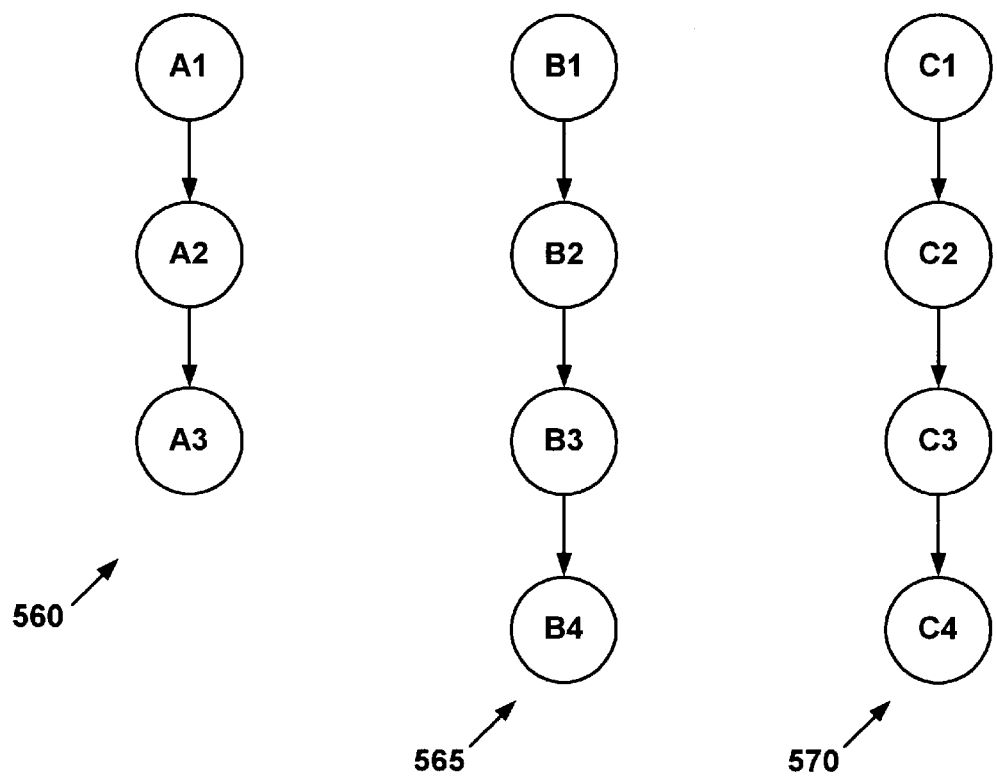
FIG. 8A is a diagram of a set of dependency graphs generated for three separate blocks of an input netlist and that can be executed in parallel by the executor process in accordance with an embodiment of the present invention.

FIG. 8A illustrates three exemplary dependency graphs 560, 565 and 570 that are not cross data dependent. In this case, the executor process 330 can execute these graphs in parallel as computer resources allow. The executor process 330 automatically determines which graphs can be separated in this fashion and executed in parallel to maximize processing speed.

Figure 8B:
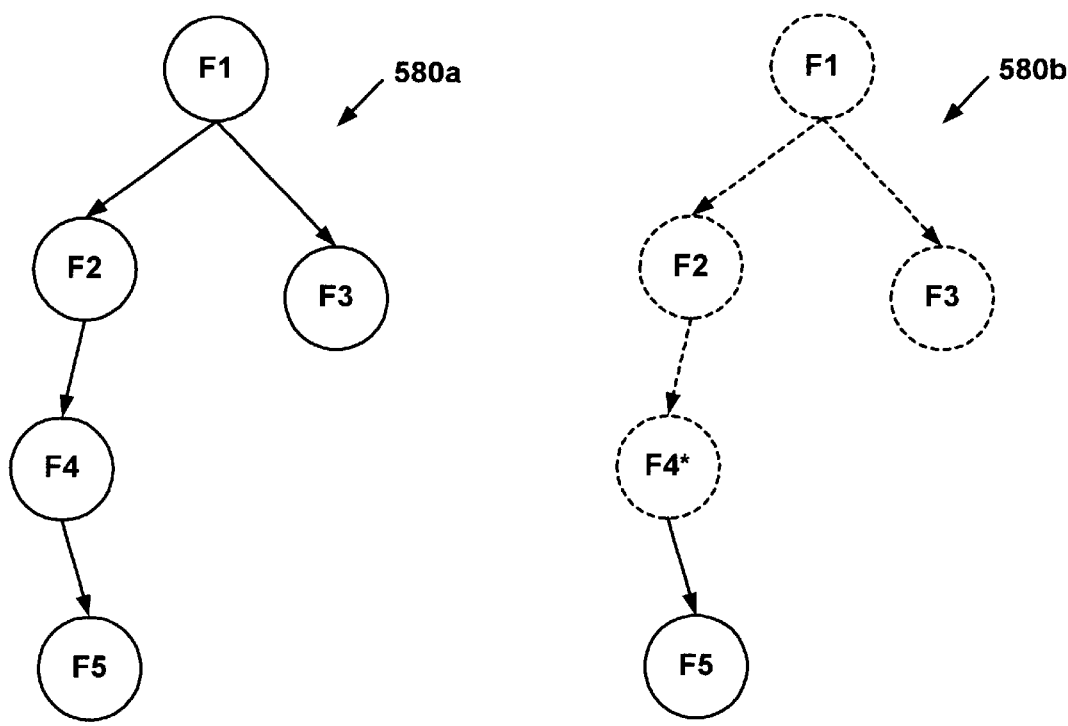
FIG. 8B is a diagram illustrating that only nodes of the dependency graphs having changed inputs need be executed by the executor process in accordance with an embodiment of the present invention.

FIG. 8B illustrates that the execution process 330 also operates efficiently by only executing those nodes in a graph whose input data has changed since the last execution. For instance, assume that graph 580a executes through the execution process 330 for the first time. Then a modification is made that alters the output data produced by node F4. A next pass through the executor process 330 is then done. Graph 580b illustrates the result where the shaded nodes F1–F3 are not executed on the next pass through, node F4 is executed because something changed in its definition that cause it to generate new data. On the other hand, the tasks associated with node F5 are executed on the next pass through because its input changed since the last execution.

The following illustrates an example of the operation of system 300. In this example, the user runs the automatic maker 315 specifying the dependencies between stages as inputs via a variable syntax for an example block. In this example, the following variable settings are specified using an exemplary syntax.

Figure 9A:
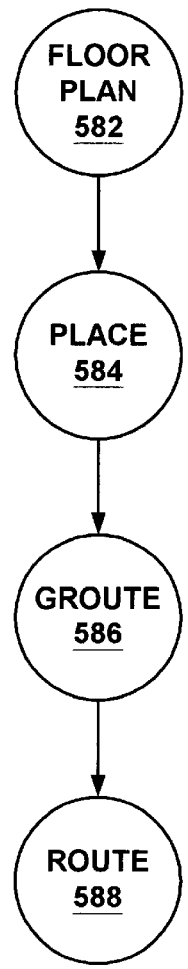
FIGS. 9A and 9B illustrate an initial set of linked stages for a given cell block and a user modified set of linked stages for the given cell block where various new stages are added to the initial set within the input file.

$AutoMake_PlaceDependStage=floorplan;
$AutoMake_GrouteDependStage=place;
$AutoMake_RouteDependStage=groute;

The setting establish the links between the stages. As a result of these input settings, the following set of linked stages 590a are created as shown in FIG. 9A. In this linked list of stages, a floorplanning stage 582, a placement stage 584, a global routing stage 586 and a routing stage 588 are included. This specifies that first floorplanning should be executed, then placement, then grouting, then routing. The automatic maker process 315 has internal data which defines the grouping of tasks associated with each stage, and outputs a special file which describes the dependencies between tasks, e.g., a dependency graph for this block.

Figure 9B:
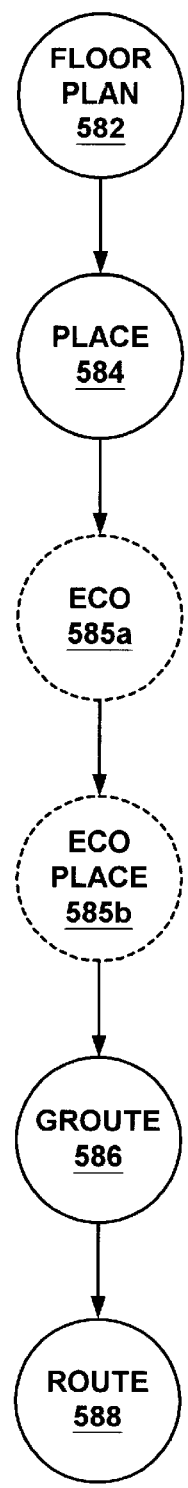

At a later stage in the design process, the user may choose a more complex flow 590b for the given block as shown in FIG. 9B. In this linked list of stages, are a floorplanning stage 582, a placement stage 584, then an ECO stage 585a, then an ECO place stage 585b, a global routing stage 586 and a routing stage 588. This specifies that first floorplanning should be executed, then placement, then ECO, then ECO placing, then grouting, then routing. This is created with the following variable settings relating to the block at issue and input to the automatic maker process 315:

$AutoMake_PlaceDependStage=floorplan;
$AutoMake_EcoDependStage=place;
$AutoMake_EcoplaceDependStage=eco;
$AutoMake_GrouteDependStage=ecoplace;
$AutoMake_RouteDependStage=groute;

The settings establish the links between the stages. To execute tasks in the resultant dependency graph, the user executes the automatic maker process 315, identifying the target node by the block name and stage. This allows the user to execute through to the end of the stage for the specified block, without needing to know the names of any nodes in the stage. Alternatively, to execute tasks in the resultant dependency graph, the user executes the automatic maker process 315, identifying the target node by the block name and node name. This allows the user to execute to a mid point in a stage for the specified block.

For example, for a block named "m11," the user could execute m11 through to the end of the placement by typing:

dependexecutor m11.place

This would execute the commands associated with the floorplan stage, following by the commands associated with the place stage.

An example of the tasks associated with the floorplan and place stages is shown below. Each of the numbered items below is a node in either the floorplan or place stage's dependency graph.

Nodes for the Floorplan Stage
1. Run floorplan code for stage
2. Diff floorplanned silo view with netlist siloview
3. Update Apollo view with results of diff Nodes for the Place Stage
4. Generate placement command file for running placer
5. Run placer
6. Run place and route tool to dump contents of database
7. Input database dump into Silo database
8. Input Scan ECO into Silo database
9. Record placement status data in status file
10. Generate user readable summary of placement operation An example of executing up through a target that is midway into the place stage is shown below:

dependexecutor m11.place.dump

This would execute up to and through step (7) above.

Additional nodes may exist for a given stage, which only become executed when specifically asked for by the user. Some examples, for the place stage, are:

exec m11.place.backup

Which functions to backup data associated with the place stage.

exec m11.place.v

This command generates a verilog file associated with place stage., exec m11.place.siloview This command causes a view place stage using silo.

exec m11.place.apolloview

This command views the place stage using silo.

exec m11.place.tim_setup

This command runs setup timing for place stage.

exec m11.place.tim_hold

This command runs hold timing for place stage.

The preferred embodiment of the present invention, a method and system for automatically generating a set of dependency graphs from an input definition of high level linked stages for cell blocks and executing that dependency graph to perform physical design operations, is thus described. While the present invention has been described in particular embodiments, it should be appreciated that the present invention should not be construed as limited by such embodiments, but rather construed according to the below claims.

What is claimed is:

1. A method of performing physical design operations on an integrated circuit netlist comprising the steps of:

a) accessing an input file containing identifications of a plurality of blocks of cells of said integrated circuit netlist, each block having defined therefor a respective set of linked stages representing high level physical design operations to be performed on each block;

b) defining for each stage, a group of low level tasks to be performed in order to accomplish the stage, said low level tasks comprising commands, parameters and data to be supplied to physical design tools;

c) automatically generating, based on said input file, a separate dependency graph for each block of said plurality of blocks by mapping the associated set of linked stages, for each block, to their corresponding low level tasks and maintaining data dependencies therein; and d) executing said dependency graphs to perform physical design operations on said integrated circuit netlist as defined by said input file.

2. A method as described in claim 1 wherein said high level physical design operations represented by said stages comprise placement and routing of cells of each block.

3. A method as described in claim 2 wherein said high level physical design operations represented by said stages also comprise floorplanning.

4. A method as described in claim 3 wherein said high level physical design operations represented by said stages also comprise design rule checking.

5. A method as described in claim 1 wherein said step d) is performed by a process substantially similar to the Make program and wherein said dependency graph is substantially compatible with a Make file format.

6. A method as described in claim 1 wherein said plurality of blocks are organized in a hierarchical relationship.

7. A method as described in claim 1 wherein a first block has defined therefor a variable associated with a first stage associated with said first block and wherein, at step c), said variable modifies at least one low level task mapped to said first stage.

8. A method as described in claim 1 wherein said physical design tools comprise: a software floorplanner; a software cell placer; a software router; and a software timing analyzer.

9. A method as described in claim 1 wherein said step d) comprises the steps of:

d1) executing in parallel first and second dependency graphs, wherein said first and second dependency graphs do not have any cross data dependencies; and d2) within any dependency graph generated by step c), executing only those nodes having inputs that have changed from the last execution of said step d).

10. A method as described in claim 1 further comprising the steps of:

e) a user modifying said input file to generate a modified input file wherein at least one block has defined therefor a modified set of stages;

f) automatically generating, based on said modified input file, a separate dependency graph for each block of said plurality of blocks by mapping the associated set of linked stages, for each block, to their corresponding low level tasks and maintaining data dependencies therein; and g) executing said dependency graphs of said step f) to perform modified physical design operations on said integrated circuit netlist as defined by said modified input file.

11. A computer system comprising a processor coupled to a bus and a memory coupled to said bus and having instructions therein for implementing a method of performing physical design operations on an integrated circuit netlist comprising the steps of:

a) accessing an input file containing identifications of a plurality of blocks of cells of said integrated circuit netlist, each block having defined therefor a respective set of linked stages representing high level physical design operations to be performed on each block;

b) defining for each stage, a group of low level tasks to be performed in order to accomplish the stage, said low level tasks comprising commands, parameters and data to be supplied to physical design tools;

c) automatically generating, based on said input file, a separate dependency graph for each block of said plurality of blocks by mapping the associated set of linked stages, for each block, to their corresponding low level tasks and maintaining data dependencies therein; and d) executing said dependency graphs to perform physical design operations on said integrated circuit netlist as defined by said input file.

12. A computer system as described in claim 11 wherein said high level physical design operations represented by said stages comprise placement and routing of cells of each block.

13. A computer system as described in claim 12 wherein said high level physical design operations represented by said stages also comprise floorplanning.

14. A computer system as described in claim 13 wherein said high level physical design operations represented by said stages also comprise design rule checking.

15. A computer system as described in claim 11 wherein said step d) of said method is performed by a process substantially similar to the Make program and wherein said dependency graph is substantially compatible with a Make file format.

16. A computer system as described in claim 11 wherein said plurality of blocks are organized in a hierarchical relationship.

17. A computer system as described in claim 11 wherein a first block has defined therefor a variable associated with a first stage associated with said first block and wherein, at step c) of said method, said variable modifies at least one low level task mapped to said first stage.

18. A computer system as described in claim 11 wherein said physical design tools comprise: a software floorplanner; a software cell placer; a software router; and a software timing analyzer.

19. A computer system as described in claim 11 wherein said step d) of said method comprises the steps of:

d1) executing in parallel first and second dependency graphs, wherein said first and second dependency graphs do not have any cross data dependencies; and d2) within any dependency graph generated by step c), executing only those nodes having inputs that have changed from the last execution of said step d).

20. A computer system as described in claim 11 wherein said method further comprises the steps of:

e) a user modifying said input file to generate a modified input file wherein at least one block has defined therefor a modified set of stages;

f) automatically generating, based on said modified input file, a separate dependency graph for each block of said plurality of blocks by mapping the associated set of linked stages, for each block, to their corresponding low level tasks and maintaining data dependencies therein; and g) executing said dependency graphs of said step f) to perform modified physical design operations on said integrated circuit netlist as defined by said modified input file.

21. In a computer system, a method of performing physical design operations on an integrated circuit netlist comprising the steps of:

a) accessing an input file containing identifications of a plurality of blocks of cells of said integrated circuit netlist, each block having defined therefor a respective set of linked stages representing high level physical design operations to be performed on each block;

b) defining for each stage, a group of low level tasks to be performed in order to accomplish the stage, said low level tasks comprising commands, parameters and data to be supplied to physical design tools;

c) automatically generating, based on said input file, a separate dependency graph for each block of said plurality of blocks by mapping the associated set of linked stages, for each block, to their corresponding low level tasks and maintaining data dependencies therein; and d) executing said dependency graphs to perform physical design operations on said integrated circuit netlist as defined by said input file, wherein only nodes of said dependency graphs having changed inputs are executed by step d).

22. A method as described in claim 21 wherein said changed inputs of said step d) are evaluated based on the last execution of said d) for said netlist.

23. A method as described in claim 22 further comprising the steps of:

e) modifying said input file wherein the set of stages is modified for at least one block of said plurality of blocks;

f) performing step c) on said input file, as modified by said step e), to automatically generate modified dependency graphs; and g) performing step d) on said modified dependency graphs generated by said step f).

24. A method as described in claim 22 wherein said high level physical design operations represented by said stages comprise, for each block, cell placement, cell routing, floorplanning and design rule checking.

* * * * *